(12) United States Patent
Hoinkis

(10) Patent No.: US 6,218,298 B1
(45) Date of Patent: Apr. 17, 2001

(54) TUNGSTEN-FILLED DEEP TRENCHES

(75) Inventor: Mark D. Hoinkis, Fishkill, NY (US)

(73) Assignee: Infineon Technologies North America Corp., San Jose, CA (US)

(*) Notice: Subject to any disclaimer, the term of this patent is extended or adjusted under 35 U.S.C. 154(b) by 0 days.

(21) Appl. No.: 09/315,089

(22) Filed: May 19, 1999

(51) Int. Cl.[7] .................................................. H01L 21/44
(52) U.S. Cl. .......................... 438/675; 438/668; 438/680; 438/685
(58) Field of Search .................................. 438/648, 668, 438/680, 675, 685

(56) References Cited

U.S. PATENT DOCUMENTS

| | | | | |
|---|---|---|---|---|
| 5,202,754 | * | 4/1993 | Bertin et al. ........................... | 257/684 |
| 5,795,824 | * | 8/1998 | Hancock ................................ | 438/656 |
| 6,022,800 | * | 2/2000 | Ho et al. ............................... | 438/643 |
| 6,066,366 | * | 5/2000 | Berenbaum et al. ................. | 427/250 |

OTHER PUBLICATIONS

Pierson, H.O., Handbook of Chemical Vapor Deposition (CVD): Principles, Technology and Applications. Noyes Publications, 1992. pp. 148–151.*

Tanaka et al., "Integration of CVD W on IMP Ti and TiN"; Proceedings on 5th International Conference on Solid–State and Integrated Circuit Technology, 1998. pp. 207–210.*

* cited by examiner

*Primary Examiner*—Olik Chaudhuri
*Assistant Examiner*—Ginette Peralta

(57) ABSTRACT

A satisfactory conductive fill of a vertical trench of aspect ratio of at least 20 to 1 in a silicon substrate is obtained by heating the substrate to a temperature of about 375° C. or less in a chamber for chemical vapor deposition along with a mixture of $WF_6$, $H_2$, and $SiH_4$ for filling the trench with tungsten. Also, $W(CO)_6$ may be substituted for the $WF_6$.

1 Claim, No Drawings

TUNGSTEN-FILLED DEEP TRENCHES

FIELD OF INVENTION

This relates to the filling of relatively deep vertical trenches, and more particularly, to such trenches for use in dynamic random access memories as the storage capacitors providing the storage node.

BACKGROUND OF THE INVENTION

There is interest in the use of trench capacitors for use as the storage node in the memory cells of dynamic random access memories (DRAMs). Such capacitors offer the potential of relatively large capacitances with the consumption of relatively little surface area, which permits a higher density of memory cells in a silicon chip of a given size. Typically such vertical cells have been filled with doped polysilicon because of its convenience of use.

However, as the cross section of the vertical trench has been shrunk while its depth has been increased to get a desired capacitance with smaller consumption of chip surface area, the resulting increased resistance has become a matter of concern, since it increases the time to charge/discharge the capacitor, thereby limiting performance. While it has been recognized that the substitution of a material, such as a metal, for the doped polysilicon fill, would result in a lower resistance, it has proven difficult to find a suitable metal for filling trenches with aspect ratios much in excess of 10. The present invention is addressed to this problem.

SUMMARY OF THE INVENTION

The present invention is directed to a process for filling with tungsten a vertical trench with an aspect ratio of at least twenty in a silicon substrate that comprises heating the silicon chip in a chamber for chemical vapor deposition to a temperature of about 375° C. or less while flowing into the chamber a tungsten compound suitable for chemical vapor deposition. In a preferred embodiment for achieving aspect ratios in the range of 30 to 40, the tungsten compound is $WF_6$, the temperature is between 350° C. and 375° C. and before the deposit of the tungsten, there is formed over the walls of the trench a nucleation film by flowing through the chamber a mixture of $SiH_4$, $H_2$ and $WF_6$.

DETAILED DESCRIPTION

I have found that chemically vapor deposited (CVD) tungsten can be used as the fill for vertical trenches with aspect ratios well in excess of 10-1, for example at least twenty and as high as thirty to forty. In particular, for such use it has been found important to deposit the tungsten at a temperature of about 375° C. or less, and preferably in the range of between about 350° C. and 375° C. In the past CVD tungsten has been used to fill trenches with aspect ratios of as high as about 10, but with high temperature processes, typically with temperatures higher than 400° C.

The high temperature was thought to be important for several reasons. First, sufficiently good fill had been obtained with such temperature for aspect ratios as high as 10 and with this success discouraged investigation of lower temperatures. Second, the deposition rate is higher the higher the temperature and so reduces desirably the processing time. Third, the film stress in the fill is desirably lower the higher the temperature of deposition. As a result, no advantage was thought to reside in use of lower deposition temperature and there was no appreciation of its advantages for trenches of high aspect ratios.

However, I have found that at a deposition temperature of about 400° C. with a vertical trench having an aspect ratio in the range of 30 to 40, for example a trench 0.18 micron wide and 6.0 microns deep, only about the top third of the trench is filled because the rapid build-up of deposit on the walls of the trench near the top of the trench seal and limits access of the deposit to the lower portions of the trench. At a deposition temperature of about 375° C., approximately the top two thirds is filled. However, at a deposition temperature of 350° C., the whole trench is filled, albeit with a seam in the middle of the fill that little affects its use in a capacitor. In particular, it appears that with trenches of aspect ratios in excess of 20, and particularly in the range of 30 to 40, there is a clear advantage in doing the deposition at about 375° C. or lower and preferably at about 350° C. In addition, it is reasonable to expect that at still higher aspect ratios, it may be advantageous to go to still lower temperatures for more complete fills.

The invention seems best to be best practiced by using Novellus CVD apparatus designed for deposition of the tungsten. The silicon wafer that housed the vertical trenches to be filled was maintained at the desired operating temperature by maintaining at the desired temperature the heater on which the wafer was supported. Tungsten hexafluoride $WF_6$ was introduced into the deposition chamber at 9,000 SCCM along with hydrogen gas at between 5,000–10,000 SCCM and argon at between 10,000 and 15,000 SCCM. It was generally found advantageous to form first over the walls of the trench a nucleation film no more than about 500° A thick by flowing over the wafer a mixture of silane ($SiH_4$), hydrogen, and tungsten hexafluoride.

Since tungsten has a conductivity about 50 times higher than can normally be obtained in doped polysilicon, a substantive decrease in the resistance of the fill in trenches with aspect ratios above 20 can be realized with the invention.

It is expected that other tungsten compounds that can be used for depositing the tungsten include tungsten hexacarbonyl $W(CO)_6$.

What is claimed is:

1. A process of filling in a silicon substrate a vertical trench with an aspect ratio between 30 and 40 comprising the steps of:

maintaining the silicon substrate at a temperature of about 350° C. while flowing therepast a mixture consisting of $WF_6$, $H_2$, and $SiH_4$ for forming over the walls of the trench a nucleation film no greater than 500 Angstroms thick; and maintaining the silicon substrate at a temperature of about 350° C. for a time to essentially fill the trench while flowing therepast a mixture consisting of $WF_6$, $H_2$, and argon.

* * * * *